US011923177B2

(12) United States Patent
Tabuki et al.

(10) Patent No.: US 11,923,177 B2
(45) Date of Patent: Mar. 5, 2024

(54) PLASMA PROCESSING APPARATUS AND PLASMA PROCESSING METHOD

(71) Applicant: TOKYO ELECTRON LIMITED, Tokyo (JP)

(72) Inventors: Keiji Tabuki, Nirasaki (JP); Yamato Tonegawa, Nirasaki (JP); Kazumasa Igarashi, Nirasaki (JP); Kazuo Yabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/305,389

(22) Filed: Jul. 6, 2021

(65) Prior Publication Data

US 2022/0013333 A1   Jan. 13, 2022

(30) Foreign Application Priority Data

Jul. 10, 2020   (JP) ................................ 2020-119313

(51) Int. Cl.
   *H01J 37/32* (2006.01)
(52) U.S. Cl.
   CPC .. *H01J 37/32449* (2013.01); *H01J 37/32082* (2013.01); *H01J 37/32513* (2013.01); *H01J 37/32577* (2013.01)
(58) Field of Classification Search
   CPC ........... H01J 37/32862; H01J 37/32779; H01J 37/32357; H01J 37/32449; H01J 37/32513; H01J 37/32082; H01J 37/32577; C23C 16/345; C23C 16/452; C23C 16/4405; C23C 16/45527; C23C 16/45546
   See application file for complete search history.

(56) References Cited

U.S. PATENT DOCUMENTS

| 7,625,609 | B2 | 12/2009 | Matsuura |
| 10,388,511 | B2 | 8/2019 | Tonegawa |
| 10,453,735 | B2* | 10/2019 | Okajima ........... H01L 21/67069 |
| 2005/0282365 | A1* | 12/2005 | Hasebe ............. C23C 16/45523 438/513 |
| 2006/0216481 | A1 | 9/2006 | Suzuki |
| 2009/0197424 | A1* | 8/2009 | Sakai ................ C23C 16/45546 438/758 |
| 2010/0037822 | A1* | 2/2010 | Ishibashi ............. H01J 37/3244 118/723 E |

(Continued)

FOREIGN PATENT DOCUMENTS

| JP | 2004-343017 A | 12/2004 |
| JP | 2009283794 A | 12/2009 |

(Continued)

*Primary Examiner* — Tung X Le

(74) *Attorney, Agent, or Firm* — Nath, Goldberg & Meyer; Jerald L. Meyer; Tanya E. Harkins

(57) ABSTRACT

A plasma processing apparatus includes: a processing container having a vertical tubular shape and an opening formed in a side wall of the processing container, the processing container configured to accommodate a plurality of substrates in multiple stages; a plasma partition wall airtightly provided on an outer wall of the processing container and configured to cover the opening and define a plasma generation space; a plasma electrode provided along the plasma partition wall; and a processing gas supplier provided outside the plasma generation space and configured to supply a plasma generation gas.

13 Claims, 17 Drawing Sheets

(56) References Cited

U.S. PATENT DOCUMENTS

| | | | |
|---|---|---|---|
| 2010/0278999 A1* | 11/2010 | Onodera | C23C 16/402 |
| | | | 118/712 |
| 2011/0129619 A1* | 6/2011 | Matsunaga | C23C 16/45542 |
| | | | 427/248.1 |
| 2015/0007772 A1* | 1/2015 | Fukushima | H01J 37/32779 |
| | | | 118/723 E |
| 2015/0259792 A1* | 9/2015 | Nakajima | C23C 16/36 |
| | | | 427/255.394 |
| 2015/0275368 A1 | 10/2015 | Motoyama et al. | |
| 2016/0284542 A1* | 9/2016 | Noda | H01J 37/3244 |
| 2016/0365246 A1 | 12/2016 | Yamamoto et al. | |
| 2020/0312654 A1 | 10/2020 | Ito et al. | |
| 2021/0198787 A1 | 7/2021 | Tonegawa et al. | |
| 2021/0202216 A1* | 7/2021 | Sato | H01L 21/0217 |

FOREIGN PATENT DOCUMENTS

| | | |
|---|---|---|
| JP | 2013157491 A | 8/2013 |
| JP | 2018-11009 A | 1/2018 |
| WO | 2006088062 A1 | 8/2006 |

* cited by examiner

FIG. 5

| Gas supply sequence A | Step S11 (Si Flow) | Step S12 (Purge) | Step S13 (NH₃ Flow) | Step S14 (Purge) |
|---|---|---|---|---|
| DCS ⟨GN1⟩ | | 0sccm | | |
| NH₃ ⟨GN3⟩ (Outside the plasma generation space) | 0sccm | | 5000sccm | |
| N₂ ⟨GN2⟩ (Inside the plasma generation space) | 500sccm | | 50sccm | 500sccm |
| RF | OFF | | ON | |

FIG. 6

| Gas supply sequence B | Step S21 (Si Flow) | Step S22 (Purge) | Step S25 (HRP) | Step S23 (NH₃ Flow) | Step S24 (Purge) |
|---|---|---|---|---|---|
| DCS ⟨GN1⟩ | | 0sccm | | | |
| NH₃ ⟨GN3⟩ (Outside the plasma generation space) | 0sccm | | | 5000sccm | 50sccm → 500sccm |
| N₂ ⟨GN2⟩ (Inside the plasma generation space) | 500sccm | | 2000sccm | | |
| H₂ ⟨GN3⟩ (Outside the plasma generation space) | 0sccm | | | | |
| RF | OFF | | ON | | |

FIG. 9

| Gas supply sequence D | Step S41 (Si Flow) | Step S42 (Purge) | Step S45 (HRP) | Step S43 (NH₃ Flow) | Step S44 (Purge) |
|---|---|---|---|---|---|
| DCS ⟨GN1⟩ | | 0sccm | | | |
| NH₃ ⟨GN3⟩ (Outside the plasma generation space) | 0sccm | | | 5000sccm | |
| N₂ ⟨GN2⟩ (Inside the plasma generation space) | 0sccm | | | | |
| H₂ ⟨GN3⟩ (Outside the plasma generation space) | 0sccm | | 2000sccm | | |
| RF | OFF | | ON | | |

FIG. 12

| Gas supply sequence Z | Step S91 (Si Flow) | Step S92 (Purge) | Step S95 (HRP) | Step S93 (NH₃ Flow) | Step S94 (Purge) |
|---|---|---|---|---|---|
| DCS ⟨GN1⟩ | | 0sccm | | | |
| NH₃ ⟨GN2⟩ (Inside the plasma generation space) | 0sccm | | | 5000sccm | 50sccm |
| N₂ ⟨GN2⟩ (Inside the plasma generation space) | 500sccm | | 2000sccm | | 500sccm |
| H₂ ⟨GN2⟩ (Inside the plasma generation space) | 0sccm | | ON | | |
| RF | OFF | | ON | | |

PLASMA PROCESSING APPARATUS AND PLASMA PROCESSING METHOD

CROSS-REFERENCE TO RELATED APPLICATION

This application is based upon and claims the benefit of priority from Japanese Patent Application No. 2020-119313, filed on Jul. 10, 2020, the entire contents of which are incorporated herein by reference.

TECHNICAL FIELD

The present disclosure relates to a plasma processing apparatus and a plasma processing method.

BACKGROUND

In a batch-type heat treatment apparatus, there is known a technique in which a plasma generation part for generating plasma is opened toward the inside of a processing container so that the plasma generation part is brought into communication with the processing container (see, e.g., Patent Document 1).

PRIOR ART DOCUMENT

Patent Document

Patent Document 1: Japanese laid-open publication No. 2004-343017

SUMMARY

A plasma processing apparatus according to an aspect of the present disclosure includes: a processing container having a vertical tubular shape and an opening formed in a side wall of the processing container, the processing container configured to accommodate a plurality of substrates in multiple stages; a plasma partition wall airtightly provided on an outer wall of the processing container and configured to cover the opening and define a plasma generation space; a plasma electrode provided along the plasma partition wall; and a processing gas supplier provided outside the plasma generation space and configured to supply a plasma generation gas.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 5 is a diagram showing a first example of a gas supply sequence of a plasma processing method according to an embodiment.

FIG. 6 is a diagram showing a second example of the gas supply sequence of the plasma processing method according to the embodiment.

FIG. 9 is a diagram showing a fourth example of the gas supply sequence of the plasma processing method according to the embodiment.

FIG. 12 is a diagram showing another example of the gas supply sequence of the plasma processing method in the reference example.

DETAILED DESCRIPTION

Figure 1:
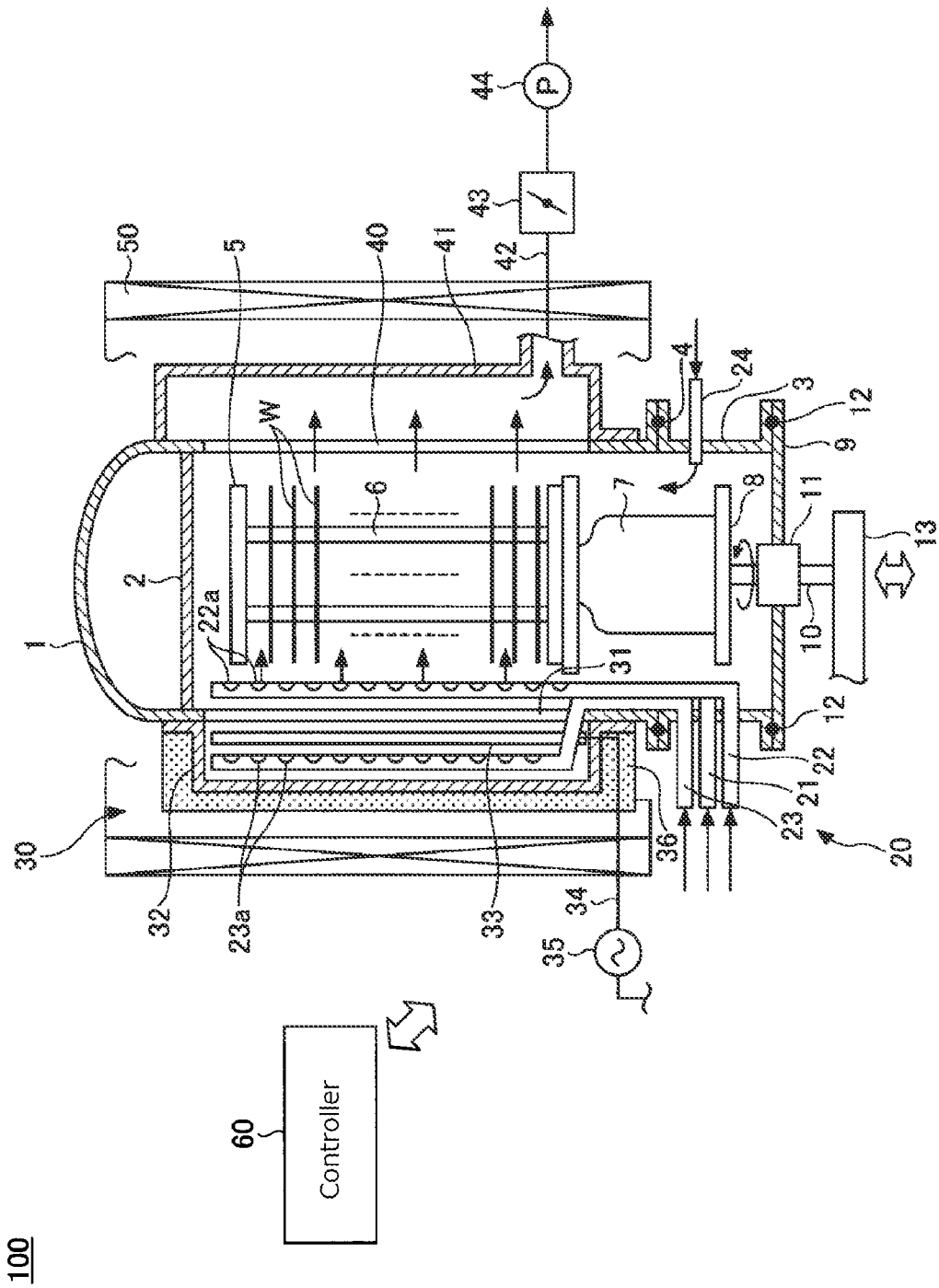
FIG. 1 is a schematic view showing an example of a plasma processing apparatus according to an embodiment.

Hereinafter, non-limiting exemplary embodiments of the present disclosure will be described with reference to the accompanying drawings. Throughout the attached drawings, the same or corresponding members or parts are designated by the same or corresponding reference numerals, and the duplicate description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Plasma Processing Apparatus]

Figure 2:
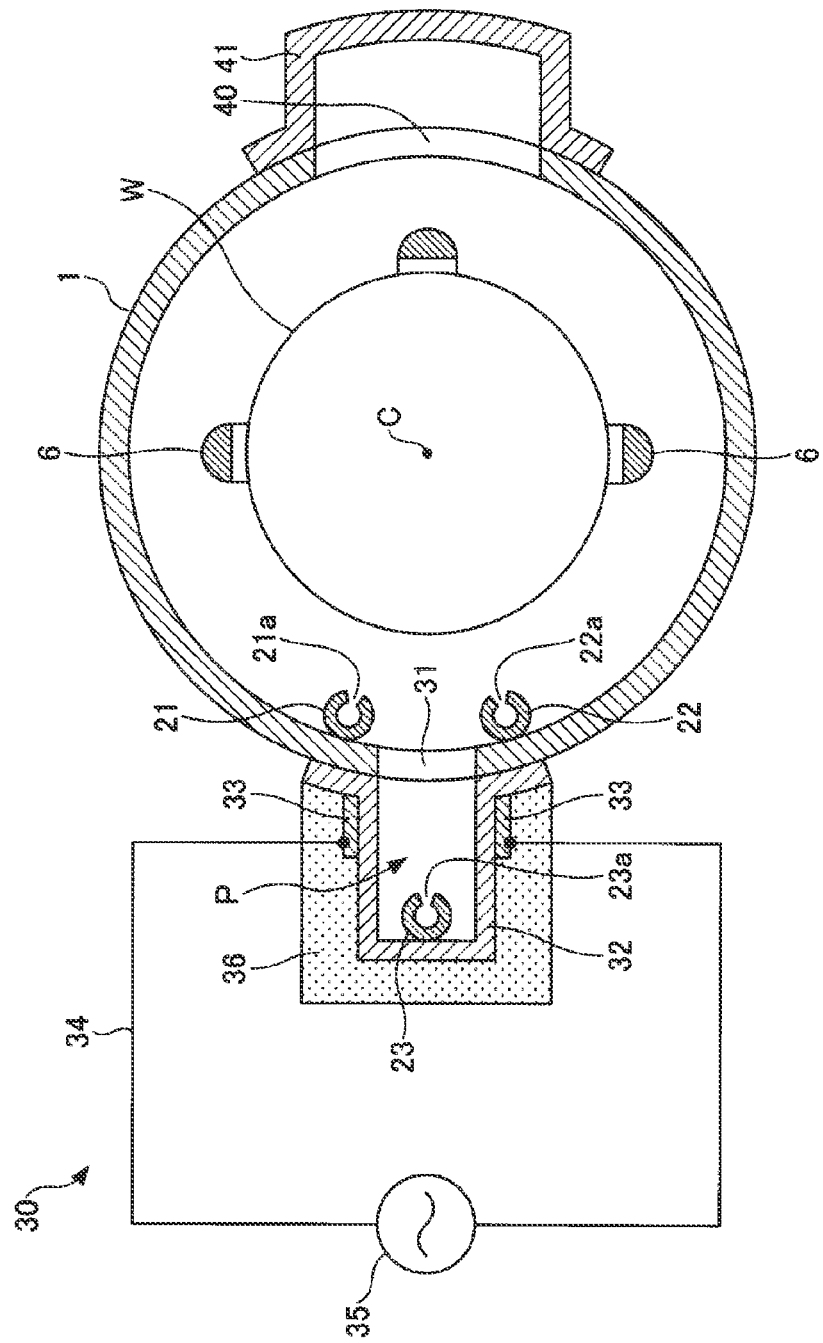
FIG. 2 is a diagram for explaining the arrangement of gas nozzles.
Figure 3:
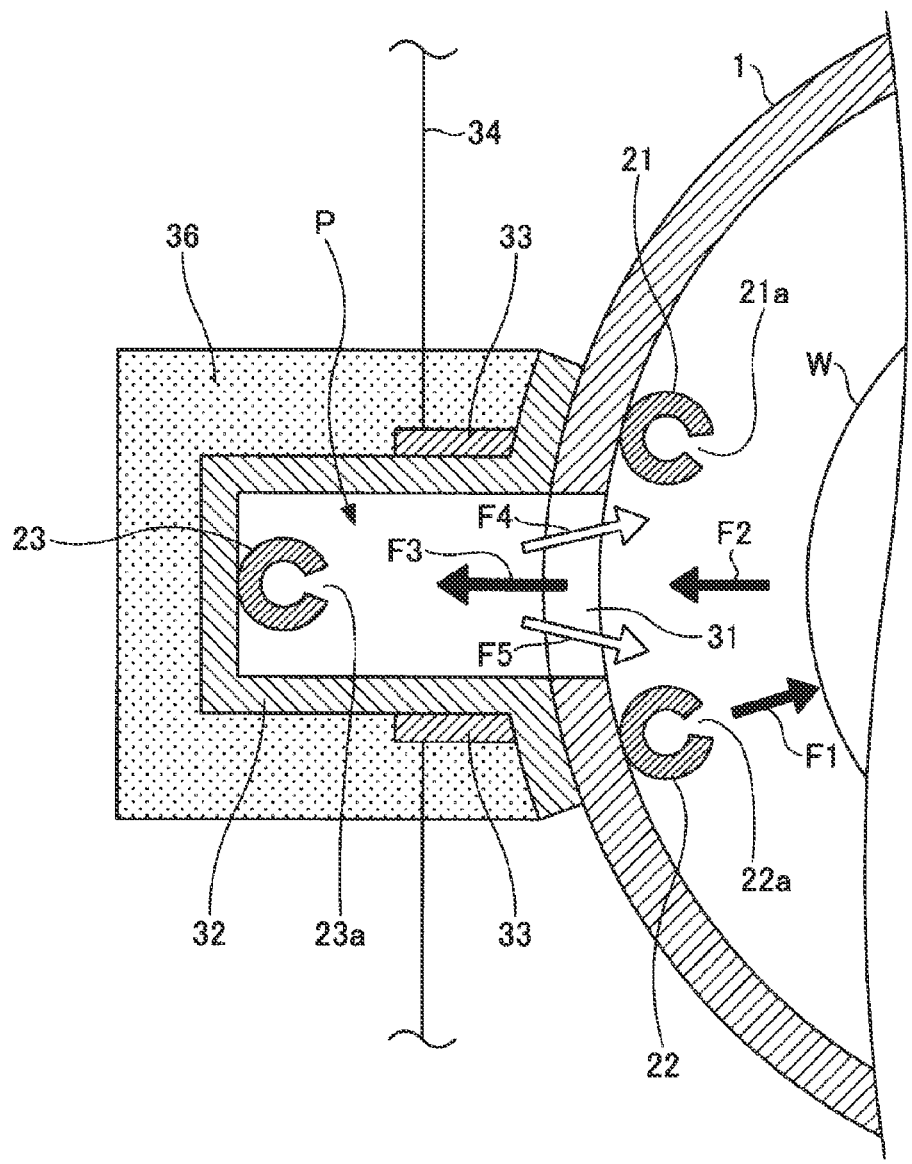
FIG. 3 is a diagram for explaining a gas flow in the plasma processing apparatus according to the embodiment.

An example of the plasma processing apparatus according to an embodiment will be described with reference to FIGS. 1 to 3. FIG. 1 is a schematic diagram showing an example of the plasma processing apparatus according to the embodiment. FIG. 2 is a diagram for explaining the arrangement of gas nozzles. FIG. 3 is a diagram for explaining a gas flow in the plasma processing apparatus according to the embodiment.

The plasma processing apparatus 100 includes a processing container 1. The processing container 1 has a vertical tubular shape with a ceiling and an open lower end. The entire processing container 1 is made of, for example, quartz. A ceiling plate 2 made of quartz is provided near the upper end of the processing container 1, and a region below the ceiling plate 2 is sealed. A metal manifold 3 formed in a tubular shape is connected to the lower end opening of the processing container 1 via a sealing member 4 such as an O-ring or the like.

The manifold 3 supports the lower end of the processing container 1. A wafer boat 5 on which a large number of (e.g., 25 to 150) semiconductor wafers (hereinafter referred to as "wafers W") as substrates are placed in multiple stages is inserted into the processing container 1 from below the manifold 3. In this way, the large number of wafers W are substantially horizontally accommodated in the processing container 1 at intervals along the vertical direction. The wafer boat 5 is made of, for example, quartz. The wafer boat 5 includes three rods 6 (see FIG. 2), and the large number of wafers W are supported by grooves (not shown) formed in the rods 6.

The wafer boat 5 is placed on a table 8 via a heat insulating cylinder 7 made of quartz. The table 8 is supported on a rotary shaft 10 penetrating a metal (stainless steel) lid 9 that opens and closes the lower end opening of the manifold 3.

A magnetic fluid seal 11 is provided at the penetrating portion of the rotary shaft 10, and is configured to hermetically seal and rotatably support the rotary shaft 10. A sealing member 12 for maintaining the airtightness in the processing container 1 is provided between the peripheral portion of the lid 9 and the lower end of the manifold 3.

The rotary shaft 10 is attached to the tip of an arm 13 supported by an elevating mechanism (not shown) such as a boat elevator or the like. The wafer boat 5 and the lid 9 are integrally moved up and down, and are inserted into and removed from the processing container 1. The table 8 may be fixedly provided on the side of the lid 9 so that the wafer W can be processed without rotating the wafer boat 5.

Further, the plasma processing apparatus 100 includes a gas supplier 20 that supplies various gases into the processing container 1.

The gas supplier 20 includes four gas nozzles 21 to 24. However, the gas supplier 20 may have another gas nozzle in addition to the four gas nozzles 21 to 24.

The gas nozzle 21 is made of, for example, quartz, and has an L-shape that penetrates the side wall of the manifold 3 inward, bends upward and extends vertically. The vertical portion of the gas nozzle 21 is provided outside a plasma generation space P, for example, inside the processing container 1 on the side of the plasma generation space P with respect to the center C of the processing container 1. Alternatively, the gas nozzle 21 may be provided so that, for example, the vertical portion thereof is located closer to an exhaust port 40 than the center C of the processing container 1 in the processing container 1. The gas nozzle 21 is connected to a source of a dichlorosilane (DCS) gas. In the vertical portion of the gas nozzle 21, a plurality of gas holes 21a is formed at intervals over the vertical length corresponding to the wafer support range of the wafer boat 5. For example, the gas holes 21a are oriented toward the center C of the processing container 1 to discharge the DCS gas toward the center C of the processing container 1 in the horizontal direction. Alternatively, for example, the gas holes 21a may be oriented toward the inner wall of the processing container 1.

The gas nozzle 22 is made of, for example, quartz, and has an L-shape that penetrates the side wall of the manifold 3 inward, bends upward and extends vertically. The vertical portion of the gas nozzle 22 is provided outside the plasma generation space P, for example, inside the processing container 1 on the side of the plasma generation space P with respect to the center C of the processing container 1. Alternatively, the gas nozzle 22 may be provided so that, for example, the vertical portion thereof is located closer to the exhaust port 40 than the center C of the processing container 1 in the processing container 1. The gas nozzle 22 is connected to a source of an ammonia gas and a source of a hydrogen gas. The ammonia gas and the hydrogen gas are examples of plasma generation gases. In the vertical portion of the gas nozzle 22, a plurality of gas holes 22a is formed at intervals over the vertical length corresponding to the wafer support range of the wafer boat 5. For example, the gas holes 22a are oriented toward the center C of the processing container 1 to discharge the ammonia gas and the hydrogen gas toward the center C of the processing container 1 in the horizontal direction. Alternatively, for example, the gas holes 22a may be oriented toward the plasma generation space P, or may be oriented toward the inner wall of the processing container 1.

The gas nozzle 23 is made of, for example, quartz, and has an L-shape that penetrates the side wall of the manifold 3 inward, bends upward and extends vertically. The vertical portion of the gas nozzle 23 is provided in the plasma generation space P. The gas nozzle 23 is connected to a source of a purge gas. In the vertical portion of the gas nozzle 23, a plurality of gas holes 23a is formed at intervals over the vertical length corresponding to the wafer support range of the wafer boat 5. For example, the gas holes 23a are oriented toward the center C of the processing container 1 to discharge the purge gas toward the center C of the processing container 1 in the horizontal direction. Examples of the purge gas may include an argon gas and a nitrogen gas.

The gas nozzle 24 is made of, for example, quartz, and has a straight pipe shape extending horizontally through the side wall of the manifold 3. The tip of the gas nozzle 24 is provided outside the plasma generation space P, for example, inside the processing container 1. The gas nozzle 24 is connected to a source of a purge gas. The gas nozzle 24 has an opening at the tip portion thereof, and supplies the purge gas into the processing container 1 from the opening. Examples of the purge gas may include an argon gas and a nitrogen gas.

A plasma generation mechanism 30 is formed on a portion of the side wall of the processing container 1. The plasma generation mechanism 30 generates active species by converting the ammonia gas and the hydrogen gas supplied from the gas nozzle 22 into plasma.

The plasma generation mechanism 30 includes a plasma partition wall 32, a pair of plasma electrodes 33, a power feeding line 34, an RF power supply 35, and an insulating protective cover 36.

The plasma partition wall 32 is airtightly welded to the outer wall of the processing container 1. The plasma partition wall 32 is made of, for example, quartz. The plasma partition wall 32 has a concave cross section and covers an opening 31 formed in the side wall of the processing container 1. The opening 31 is formed in a vertically elongated shape so as to cover all the wafers W supported by the wafer boat 5 in the vertical direction. The gas nozzle 23 for discharging the purge gas is arranged in an inner space defined by the plasma partition wall 32 and kept in communication with the inside of the processing container 1, namely in the plasma generation space P. The gas nozzle 21 for discharging the DCS gas and the gas nozzle 22 for discharging the ammonia gas and the hydrogen gas are provided at positions close to the wafers W along the inner wall surface of the processing container 1 outside the plasma generation space P.

The respective plasma electrodes 33 have an elongated shape, and are arranged so as to face away from each other along the vertical direction on the outer surfaces of the walls on both sides of the plasma partition wall 32. The power feeding line 34 is connected to the lower end of each of the plasma electrodes 33.

The power feeding line 34 electrically connects each of the plasma electrodes 33 and the RF power supply 35. For example, one end of the power feeding line 34 is connected to the lower end which is a side portion of the short side of each of the plasma electrodes 33, and the other end is connected to the RF power supply 35.

The RF power supply 35 is connected to the lower end of each of the plasma electrodes 33 via the power feeding line 34 to supply RF power of, for example, 13.56 MHz, to the pair of plasma electrodes 33. As a result, the RF power is applied to the plasma generation space P defined by the plasma partition wall 32. A portion of the ammonia gas and hydrogen gas (see arrow F1 in FIG. 3) discharged from the gas nozzle 22 into the processing container 1 is reversely diffused from the inside of the processing container 1 into the plasma generation space P through the opening 31 (see arrows F2 and F3 in FIG. 3). Then, the reversely-diffused ammonia gas and hydrogen gas are converted into plasma in the plasma generation space P. and the active species thus generated is supplied into the processing container 1 through the opening 31 (see arrows F4 and F5 in FIG. 3).

The insulating protective cover 36 is attached to the outside of the plasma partition wall 32 so as to cover the plasma partition wall 32. A refrigerant passage (not shown) is provided in the inner portion of the insulating protective cover 36, and the plasma electrodes 33 are cooled down by a refrigerant such as a nitrogen gas or the like flowing through the refrigerant passage. In some embodiments, a shield (not shown) may be provided between the plasma electrodes 33 and the insulating protective cover 36 so as to cover the plasma electrodes 33. The shield is made of a good conductor such as metal or the like and is grounded.

The exhaust port 40 for evacuating the inside of the processing container 1 is provided on the side wall portion of the processing container 1 facing the opening 31. The exhaust port 40 is vertically elongated so as to correspond to the wafer boat 5. An exhaust port cover member 41 having a U-shaped cross section is attached to a portion of the processing container 1 corresponding to the exhaust port 40 so as to cover the exhaust port 40. The exhaust port cover member 41 extends upward along the side wall of the processing container 1. An exhaust pipe 42 for evacuating the processing container 1 via the exhaust port 40 is connected to the lower portion of the exhaust port cover member 41. An exhaust device 44 including a pressure control valve 43 for controlling an internal pressure of the processing container 1 and a vacuum pump is connected to the exhaust pipe 42. The inside of the processing container 1 is evacuated by the exhaust device 44 via the exhaust pipe 42.

Further, a tubular heating mechanism 50 for heating the processing container 1 and the wafers W accommodated in the processing container 1 is provided so as to surround the outer periphery of the processing container 1.

Further, the plasma processing apparatus 100 includes a controller 60. The controller 60 controls, for example, the operation of each part of the plasma processing apparatus 100. The controller 60 may be, for example, a computer. Moreover, a computer program for executing the operation of each part of the plasma processing apparatus 100 is stored in a storage medium. The storage medium may be, for example, a flexible disk, a compact disk, a hard disk, a flash memory, a DVD, or the like.

As described above, according to the plasma processing apparatus 100 of the embodiment, the gas nozzle 22 for supplying the plasma generation gas (ammonia gas and hydrogen gas) is provided outside the plasma generation space P. Thus, a direct flow of the gas from the plasma generation space P to the wafers W inside the processing container 1 can be suppressed at the time of plasma generation. As a result, particles (e.g., peeled SiN films and quartz pieces) generated in the plasma generation space P due to the plasma sputtering of the inner wall of the plasma partition wall 32 can be prevented from adhering to the wafers W.

Further, according to the plasma processing apparatus 100 of the embodiment, the gas nozzle 22 for supplying the plasma generation gas is provided outside the plasma generation space P. Therefore, the installation area of the gas nozzle 22 can be widened. As a result, the nozzle diameter of the gas nozzle 22 can be increased, or a plurality of gas nozzles 22 can be provided. Therefore, even when the gas supply amount is increased, the flow rate of the gas flowing through the gas nozzle 22 can be reduced. As a result, it is possible to reduce the vibration of the gas nozzle 22 that may occur when the gas flows through the gas nozzle 22 at a large flow rate, and it is possible to suppress the generation of particles due to the vibration of the gas nozzle 22.

Further, according to the plasma processing apparatus 100 of the embodiment, the gas nozzle 22 for supplying the plasma generation gas is provided outside the plasma generation space P. Thus, it is possible to suppress the deactivation of the active species due to the increase in the internal pressure of the plasma generation space P. Therefore, the probability of deactivation of the active gas is reduced, and the effect of promoting reaction on the center of each wafer can be expected.

Further, according to the plasma processing apparatus 100 of the embodiment, the gas nozzle 22 for supplying the plasma generation gas is provided outside the plasma generation space P. Thus, the installation area of the gas nozzle 22 can be widened. As a result, a plurality of gas nozzles 22 may be provided. Therefore, by simultaneously supplying plural types of plasma generation gases into the processing container 1 and allowing the plasma generation gases to reversely diffuse inside the plasma generation space P, the plural types of plasma generation gases may be used to generate plasma. On the other hand, if the gas nozzle 22 for supplying the plasma generation gas is provided in the plasma generation space P, for example, only one gas nozzle 22 may be provided because the installation area of the gas nozzle 22 is narrow.

[Plasma Processing Method]

Figure 4:
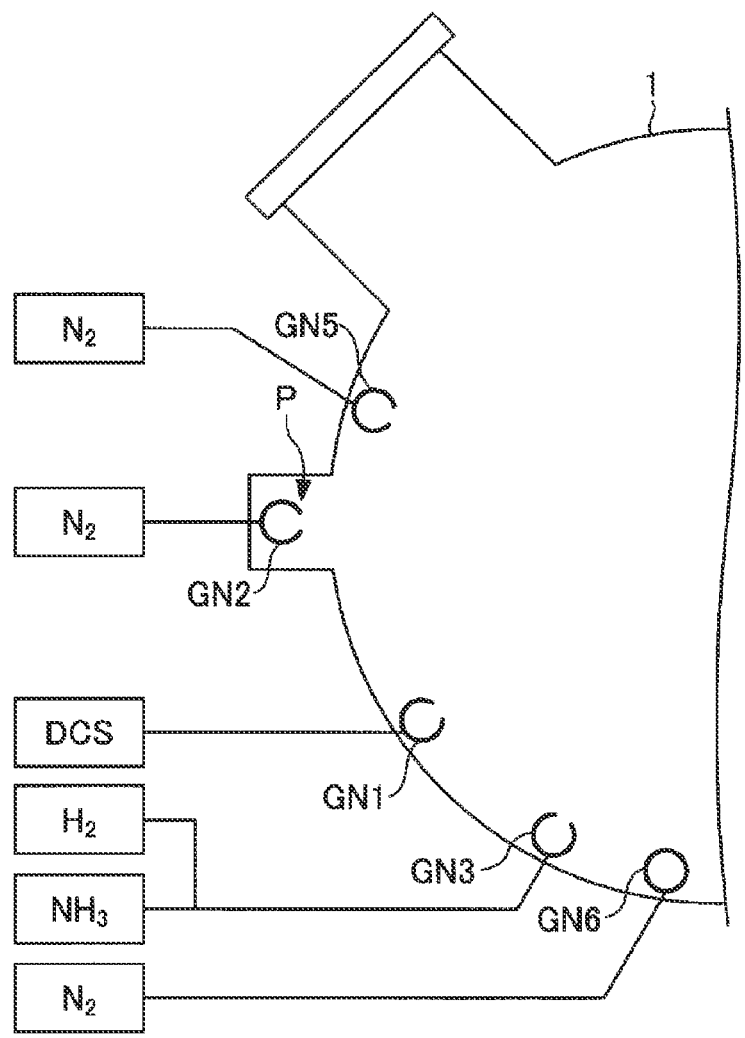
FIG. 4 is a diagram for explaining the arrangement of gas nozzles in a first example and a second example.

A first example of a plasma processing method according to an embodiment will be described with reference to FIGS. 4 and 5. FIG. 4 is a diagram for explaining the arrangement of gas nozzles in a first example and a second example. FIG. 5 is a diagram showing a first example of a gas supply sequence of the plasma processing method according to the embodiment which shows an example of a gas supply sequence for one cycle when a SiN film is formed by an atomic layer deposition (ALD) method. Hereinafter, the gas supply sequence shown in FIG. 5 is also referred to as "gas supply sequence A".

In the first example and the second example, gas nozzles GN1, GN3, GN5 and GN6 are provided inside the processing container 1 outside the plasma generation space P. and a gas nozzle GN2 is provided in the plasma generation space P.

The gas nozzles GN1, GN2, GN3 and GN5 are dispersion nozzles that extend along the vertical direction of the processing container 1 and discharge gases substantially horizontally toward the wafers W from a plurality of gas holes formed at intervals in the length direction. The gas nozzle GN6 is a nozzle that discharges a gas to the lower portion of the processing container 1.

The gas nozzle GN1 is connected to a source of a DCS gas, and is configured to supply the DCS gas into the processing container 1. The gas nozzle GN2 is connected to a source of a nitrogen ($N_2$) gas, and is configured to supply the nitrogen gas to the plasma generation space P. The gas nozzle GN3 is connected to a source of an ammonia ($NH_3$) gas and a source of a hydrogen ($H_2$) gas, and is configured to supply the ammonia gas and the hydrogen gas into the processing container 1. The gas nozzle GN5 is connected to a source of a nitrogen ($N_2$) gas, and is configured to supply the nitrogen gas into the processing container 1. The gas nozzle GN6 is connected to a source of a nitrogen ($N_2$) gas, and is configured to continuously supply the nitrogen gas to the lower portion of the processing container 1. The gas nozzles GN1 and GN3 are also connected to a source of a nitrogen gas (not shown).

The plasma processing method shown in FIG. 5 is a method of forming a SiN film by repeating a cycle including step S11 of supplying the DCS gas, step S12 of performing purging, step S13 of supplying the ammonia gas and step S14 of performing purging.

In the step S11 of supplying the DCS gas, the DCS gas is adsorbed to the wafers W. In the present embodiment, the DCS gas is supplied from the gas nozzle GN1 into the processing container 1, the nitrogen gas is supplied from the gas nozzle GN2 to the plasma generation space P. and the nitrogen gas is supplied from the gas nozzles GN1, GN3, GN5 and GN6 into the processing container 1. The DCS gas is temporarily stored in a buffer tank in the step S13 of supplying the ammonia gas, and is supplied into the processing container 1 at once in a state in which the DCS gas is pressurized in the step S11 of supplying the DCS gas. Alternatively, the DCS gas may be supplied into the processing container 1 without being stored in the buffer tank. The amount of the DCS gas supplied from the gas nozzle GN1 is, for example, 300 sec. The flow rates of the nitrogen gas supplied from the gas nozzles GN1, GN2, GN3, GN5 and GN6 are, for example, 500 sccm, 500 sccm, 200 sccm, 50 sccm and 50 sccm, respectively. In the step S11 of supplying the DCS gas, no RF power is applied to the plasma generation space P.

The step S12 of performing purging is performed after the step S11 of supplying the DCS gas. In the step S12 of performing purging, the DCS gas remaining in the plasma generation space P and the processing container 1 is removed. In the present embodiment, the nitrogen gas is supplied from the gas nozzle GN2 to the plasma generation space P, and the nitrogen gas is supplied from the gas nozzles GN1, GN3, GN5 and GN6 into the processing container 1. As a result, the DCS gas remaining in the plasma generation space P and the processing container 1 is discharged, so that the plasma generation space P and the processing container 1 are brought to a nitrogen atmosphere. The flow rates of the nitrogen gas supplied from the gas nozzles GN1, GN2, GN3, GN5 and GN6 are, for example, 5,000 sccm, 500 sccm, 5,000 sccm, 50 sccm and 50 sccm, respectively. In the step S12 of performing purging, no RF power is applied to the plasma generation space P.

The step S13 of supplying the ammonia gas is performed after the step S12 of performing purging. In the step S13 of supplying the ammonia gas, a reaction product of the DCS gas and the ammonia gas adsorbed to the wafers W is generated. In the present embodiment, the ammonia gas is supplied from the gas nozzle GN3 into the processing container 1, the nitrogen gas is supplied from the gas nozzle GN2 to the plasma generation space P, and the nitrogen gas is supplied from the gas nozzles GN1, GN3, GN5 and GN6 into the processing container 1. Further, by turning on the RF power supply 35, RF power is applied to the plasma generation space P. In the step S13 of supplying the ammonia gas, a portion of the ammonia gas supplied from the gas nozzle GN3 into the processing container 1 is reversely-diffused from the inside of the processing container 1 to the plasma generation space P. Then, the reversely-diffused ammonia gas is converted into plasma in the plasma generation space P. The active species thus generated is supplied into the processing container 1 to react with the DCS gas to generate the reaction product. The flow rate of the ammonia gas supplied from the gas nozzle GN3 is, for example, 5,000 sccm. The flow rate of the nitrogen gas supplied from the gas nozzle GN2 is preferably smaller than the flow rate of the nitrogen gas supplied from the gas nozzle GN2 in the step S11 of supplying the DCS gas, and is, for example, 50 sccm. By reducing the flow rate of the nitrogen gas supplied from the gas nozzle GN2 in this way, the ammonia gas supplied from the gas nozzle GN3 tends to be reversely-diffused from the inside of the processing container 1 to the plasma generation space P. The flow rates of the nitrogen gas supplied from the gas nozzles GN1, GN3, GN5 and GN6 are, for example, 1,000 sccm, 500 sccm, 50 sccm and 50 sccm, respectively.

The step S14 of performing purging is performed after the step S13 of supplying the ammonia gas. In the step S14 of performing purging, the ammonia gas remaining in the plasma generation space P and the processing container 1 is removed. In the present embodiment, the nitrogen gas is supplied from the gas nozzle GN2 into the plasma generation space P. and the nitrogen gas is supplied from the gas nozzles GN1, GN3, GN5 and GN6 into the processing container 1. As a result, the ammonia gas remaining in the plasma generation space P and the processing container 1 is discharged, so that the plasma generation space P and the processing container 1 are brought to a nitrogen atmosphere. The flow rates of the nitrogen gas supplied from the gas nozzles GN1, GN2, GN3, GN5 and GN6 are, for example, 500 sccm, 500 sccm, 200 sccm, 50 sccm and 50 sccm, respectively. In the step S14 of performing purging, no RF power is applied to the plasma generation space P.

A SiN film can be formed on each wafer W by executing the cycle including the above steps S11 to S14 a plurality of times.

As described above, according to the gas supply sequence A, in the step S13 of supplying the ammonia gas, the ammonia gas is supplied from the gas nozzle GN3 provided inside the processing container 1 outside the plasma generation space P, and the RF power is applied to the plasma generation space P. As a result, a portion of the ammonia gas supplied from the gas nozzle GN3 into the processing container 1 is reversely-diffused from the inside of the processing container 1 to the plasma generation space P. Then, the reversely-diffused ammonia gas is converted into plasma in the plasma generation space P, and the active species thus generated is supplied into the processing container 1 to react with the DCS gas to generate the reaction product. Therefore, the direct flow of the gas from the plasma generation space P to the wafers W in the processing container 1 can be suppressed. As a result, the particles generated in the plasma generation space P due to the plasma sputtering of the inner wall of the plasma partition wall 32 can be prevented from adhering to the wafers W.

Further, according to the gas supply sequence A, the nitrogen gas is supplied from the gas nozzle GN2 provided in the plasma generation space P in at least the step S11 of supplying the DCS gas, the step S12 of performing purging, and the step S14 of performing purging. Thus, the amount of the film formed on the inner wall of the plasma partition wall 32 is reduced, and the occurrence of film peeling can be suppressed. As a result, the amount of particles generated in the plasma generation space P can be reduced.

A second example of the plasma processing method according to the embodiment will be described with reference to FIGS. 4 and 6. FIG. 6 is a diagram showing the second example of the gas supply sequence of the plasma processing method according to the embodiment, which shows an example of the gas supply sequence for one cycle when a SiN film is formed by an ALD method. Hereinafter, the gas supply sequence shown in FIG. 6 is also referred to as "gas supply sequence B".

The plasma processing method shown in FIG. 6 is a method of forming a SiN film by repeating a cycle including step S21 of supplying a DCS gas, step S22 of performing purging, step S25 of supplying a hydrogen gas, step S23 of supplying an ammonia gas and step S24 of performing purging.

The step S21 of supplying the DCS gas, the step S22 of performing purging, the step S23 of supplying the ammonia gas and the step S24 of performing purging are the same as the steps S11 to S14 in the first example.

The step S25 of supplying the hydrogen gas is performed after the step S22 of performing purging and before the step S23 of supplying the ammonia gas. In the step S25 of supplying the hydrogen gas, hydrogen plasma is generated, and the wafers W accommodated in the processing container 1 are processed with the hydrogen plasma. In the present embodiment, the hydrogen gas is supplied from the gas nozzle GN3 into the processing container 1, the nitrogen gas is supplied from the gas nozzle GN2 to the plasma generation space P, and the nitrogen gas is supplied from the gas nozzles GN1, GN3, GN5 and GN6 into the processing container 1. Further, by turning on the RF power supply 35, RF power is applied to the plasma generation space P. In the step S25 of supplying the hydrogen gas, a portion of the hydrogen gas supplied from the gas nozzle GN3 into the processing container 1 is reversely-diffused from the inside of the processing container 1 to the plasma generation space P. Then, the reversely-diffused hydrogen gas is converted into plasma in the plasma generation space P. and the active species thus generated is supplied into the processing container 1. The flow rate of the hydrogen gas supplied from the gas nozzle GN3 is, for example, 2,000 sccm. The flow rate of the nitrogen gas supplied from the gas nozzle GN2 is preferably smaller than the flow rate of the nitrogen gas supplied from the gas nozzle GN2 in the step S21 of supplying the DCS gas, and is, for example, 50 sccm. By reducing the flow rate of the nitrogen gas supplied from the gas nozzle GN2 in this way, the hydrogen gas supplied from the gas nozzle GN3 tends to be reversely-diffused from the inside of the processing container 1 to the plasma generation space P. The flow rates of the nitrogen gas supplied from the gas nozzles GN1, GN3, GN5 and GN6 are, for example, 1,000 sccm, 500 sccm, 50 sccm and 50 sccm, respectively.

A SiN film can be formed on each wafer W by executing the cycle including the above steps S21 to S25 a plurality of times.

As described above, according to the gas supply sequence B, in the step S13 of supplying the ammonia gas, the ammonia gas is supplied from the gas nozzle GN3 provided inside the processing container 1 and outside the plasma generation space P. and the RF power is applied to the plasma generation space P. As a result, a portion of the ammonia gas supplied from the gas nozzle GN3 into the processing container 1 is reversely-diffused from the inside of the processing container 1 to the plasma generation space P. Then, the reversely-diffused ammonia gas is converted into plasma in the plasma generation space P. and the active species thus generated is supplied into the processing container 1 to react with the DCS gas to generate a reaction product. Therefore, the direct flow of the gas from the plasma generation space P to the wafers W in the processing container 1 can be suppressed. As a result, the particles generated in the plasma generation space P due to the plasma sputtering of the inner wall of the plasma partition wall 32 can be prevented from adhering to the wafers W.

Further, according to the gas supply sequence B, the nitrogen gas is supplied from the gas nozzle GN2 provided in the plasma generation space P in at least the step S21 of supplying the DCS gas, the step S22 of performing purging, and the step S24 of performing purging. Thus, the amount of the film formed on the inner wall of the plasma partition wall 32 is reduced, and the occurrence of film peeling can be suppressed. As a result, the amount of particles generated in the plasma generation space P can be reduced.

Further, according to the gas supply sequence B, in the step S25 of supplying the hydrogen gas, the hydrogen gas is supplied from the gas nozzle GN3 provided inside the processing container 1 and outside the plasma generation space P, and RF power is applied to the plasma generation space P. As a result, a portion of the hydrogen gas supplied from the gas nozzle GN3 into the processing container 1 is reversely-diffused from the inside of the processing container 1 to the plasma generation space P. Then, the reversely-diffused hydrogen gas is converted into plasma in the plasma generation space P, and the active species thus generated is supplied into the processing container 1. Therefore, the direct flow of the gas from the plasma generation space P to the wafers W in the processing container 1 can be suppressed. As a result, the particles generated in the plasma generation space P due to the plasma sputtering of the inner wall of the plasma partition wall 32 can be prevented from adhering to the wafers W.

Figure 7:
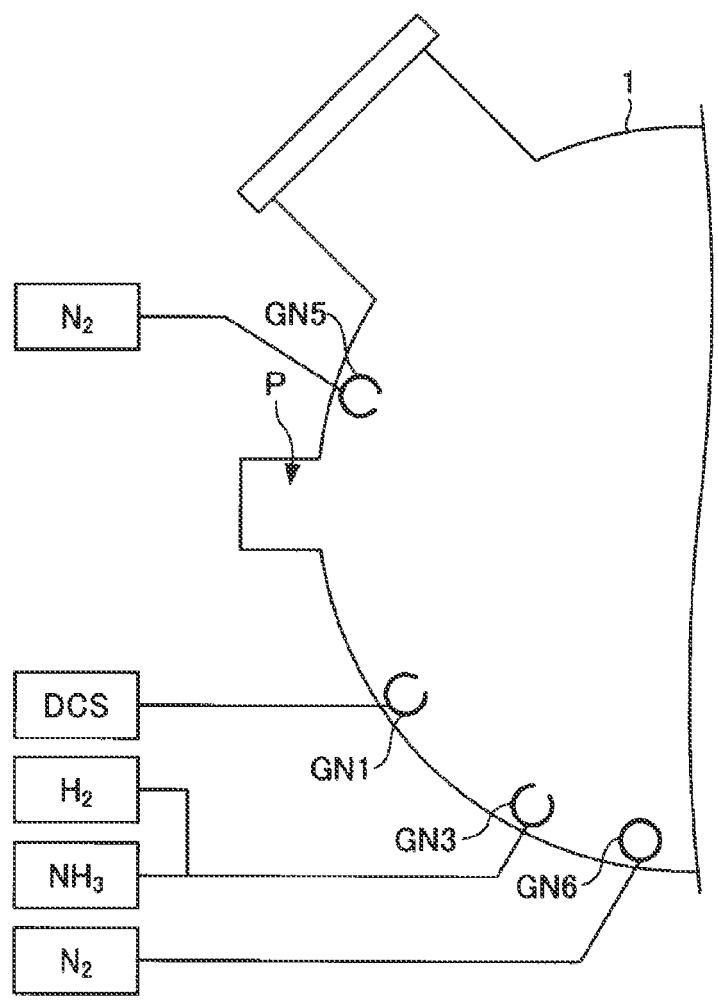
FIG. 7 is a diagram for explaining the arrangement of gas nozzles in a third example and a fourth example.
Figure 8:
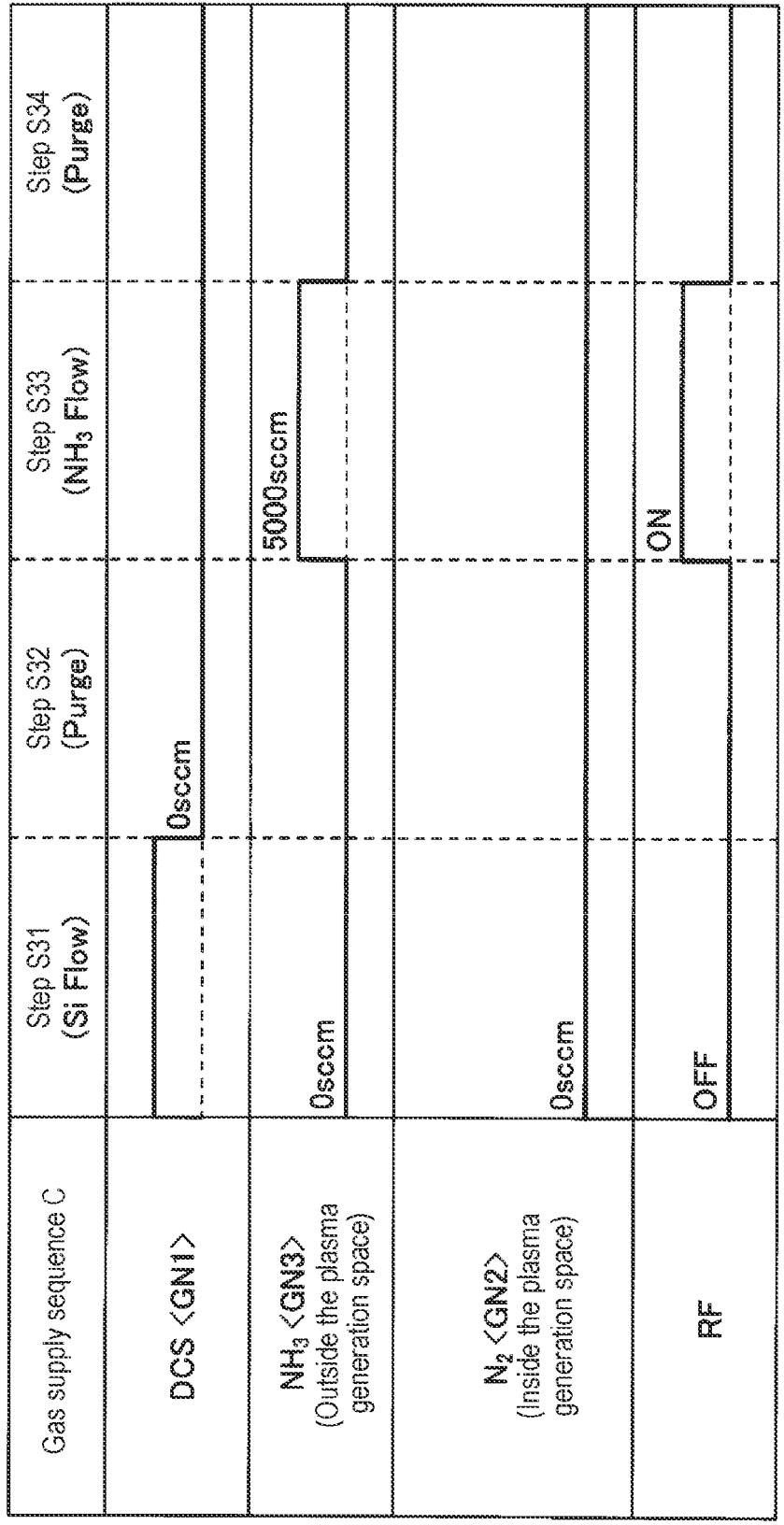
FIG. 8 is a diagram showing a third example of the gas supply sequence of the plasma processing method according to the embodiment.

A third example of the plasma processing method according to the embodiment will be described with reference to FIGS. 7 and 8. FIG. 7 is a diagram for explaining the arrangement of gas nozzles in a third example and a fourth example. FIG. 8 is a diagram showing the third example of the gas supply sequence of the plasma processing method according to the embodiment, which shows an example of the gas supply sequence for one cycle when a SiN film is formed by an ALD method. Hereinafter, the gas supply sequence shown in FIG. 8 is also referred to as "gas supply sequence C".

In the third example and the fourth example, the gas nozzles GN1, GN3, GN5 and GN6 are provided inside the processing container 1 and outside the plasma generation space P. No nozzle is provided in the plasma generation space P.

The gas nozzles GN1, GN3 and GN5 are dispersion nozzles that extend along the vertical direction of the processing container 1 and discharge gases substantially horizontally toward the wafers W from a plurality of gas holes formed at intervals in the length direction thereof. The gas nozzle GN6 is a nozzle that discharges a gas to the lower portion of the processing container 1. The gas nozzles GN1, GN3, GN5 and GN6 are the same as those shown in FIG. 4.

The plasma processing method shown in FIG. 8 is a method of forming a SiN film by repeating a cycle including step S31 of supplying a DCS, step S32 of performing purging, step S33 of supplying an ammonia gas and step S34 of performing purging.

The gas supply sequence C is different from the gas supply sequence A in that no nitrogen gas is supplied to the plasma generation space P in the steps S31 to S34. The other points are the same as those of the gas supply sequence A.

According to the gas supply sequence C, in the step S33 of supplying the ammonia gas, the ammonia gas is supplied from the gas nozzle GN3 provided inside the processing container 1 and outside the plasma generation space P, and the RF power is applied to the plasma generation space P. As a result, a portion of the ammonia gas supplied from the gas nozzle GN3 into the processing container 1 is reversely-diffused from the inside of the processing container 1 to the plasma generation space P. Then, the reversely-diffused ammonia gas is converted into plasma in the plasma generation space P, and the active species thus generated is supplied into the processing container 1 to react with the DCS gas to generate a reaction product. Therefore, the direct flow of the gas from the plasma generation space P to the wafers W in the processing container 1 can be suppressed. As a result, the particles generated in the plasma generation space P due to the plasma sputtering of the inner wall of the plasma partition wall 32 can be prevented from adhering to the wafers W.

A fourth example of the plasma processing method according to the embodiment will be described with reference to FIGS. 7 and 9. FIG. 9 is a diagram showing the fourth example of the gas supply sequence of the plasma processing method according to the embodiment, which shows an example of the gas supply sequence for one cycle when a SiN film is formed by an ALD method. Hereinafter, the gas supply sequence shown in FIG. 9 is also referred to as "gas supply sequence D".

The plasma processing method shown in FIG. 9 is a method of forming a SiN film by repeating a cycle including step S41 of supplying a DCS gas, step S42 of performing purging, step S45 of supplying a hydrogen gas, step S43 of supplying an ammonia gas and step S44 of performing purging.

The gas supply sequence D is different from the gas supply sequence B in that no nitrogen gas is supplied to the plasma generation space P in the steps S41 to S45. The other points are the same as those of the gas supply sequence B.

According to the gas supply sequence D, in the step S43 of supplying the ammonia gas, the ammonia gas is supplied from the gas nozzle GN3 provided inside the processing container 1 and outside the plasma generation space P, and the RF power is applied to the plasma generation space P. As a result, a portion of the ammonia gas supplied from the gas nozzle GN3 into the processing container 1 is reversely-diffused from the inside of the processing container 1 to the plasma generation space P. Then, the reversely-diffused ammonia gas is converted into plasma in the plasma generation space P, and the active species thus generated is supplied into the processing container 1 to react with the DCS gas to generate a reaction product. Therefore, the direct flow of the gas from the plasma generation space P to the wafers W in the processing container 1 can be suppressed. As a result, the particles generated in the plasma generation space P due to the plasma sputtering of the inner wall of the plasma partition wall 32 can be prevented from adhering to the wafers W.

Further, according to the gas supply sequence D, in the step S45 of supplying the hydrogen gas, the hydrogen gas is supplied from the gas nozzle GN3 provided inside the processing container 1 and outside the plasma generation space P, and RF power is applied to the plasma generation space P. As a result, a portion of the hydrogen gas supplied from the gas nozzle GN3 into the processing container 1 is reversely-diffused from the inside of the processing container 1 to the plasma generation space P. Then, the reversely-diffused hydrogen gas is converted into plasma in the plasma generation space P, and the active species thus generated is supplied into the processing container 1. Therefore, the direct flow of the gas from the plasma generation space P to the wafers W in the processing container 1 can be suppressed. As a result, the particles generated in the plasma generation space P due to the plasma sputtering of the inner wall of the plasma partition wall 32 can be prevented from adhering to the wafers W.

Figure 10:
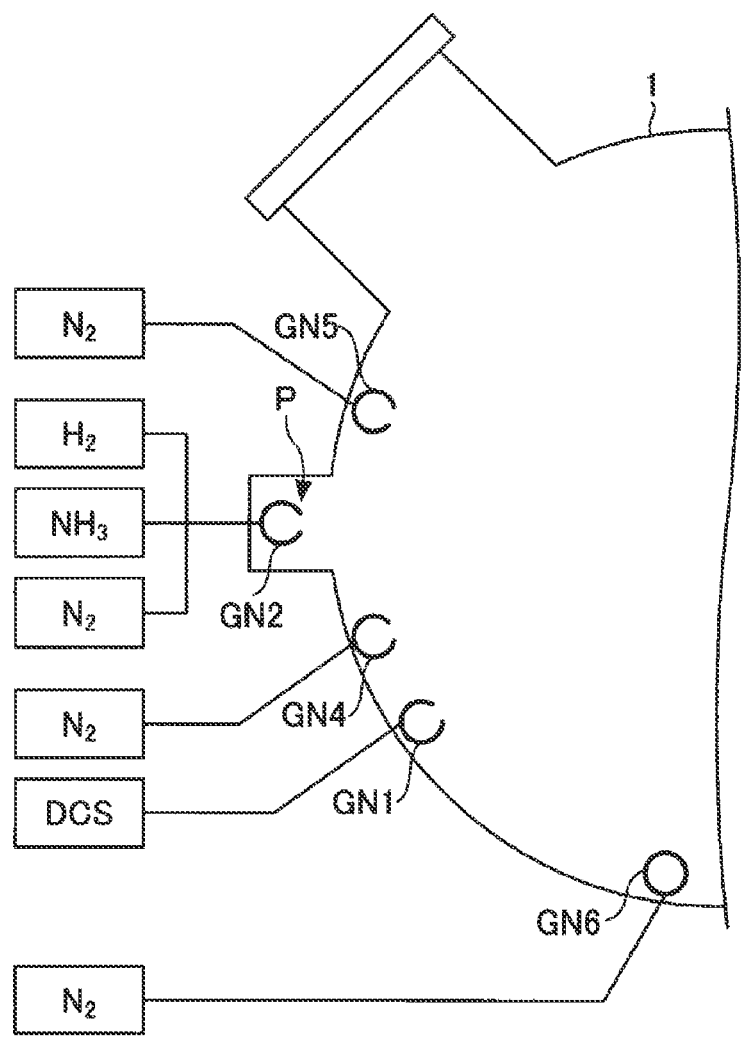
FIG. 10 is a diagram for explaining the arrangement of gas nozzles in a reference example.
Figure 11:
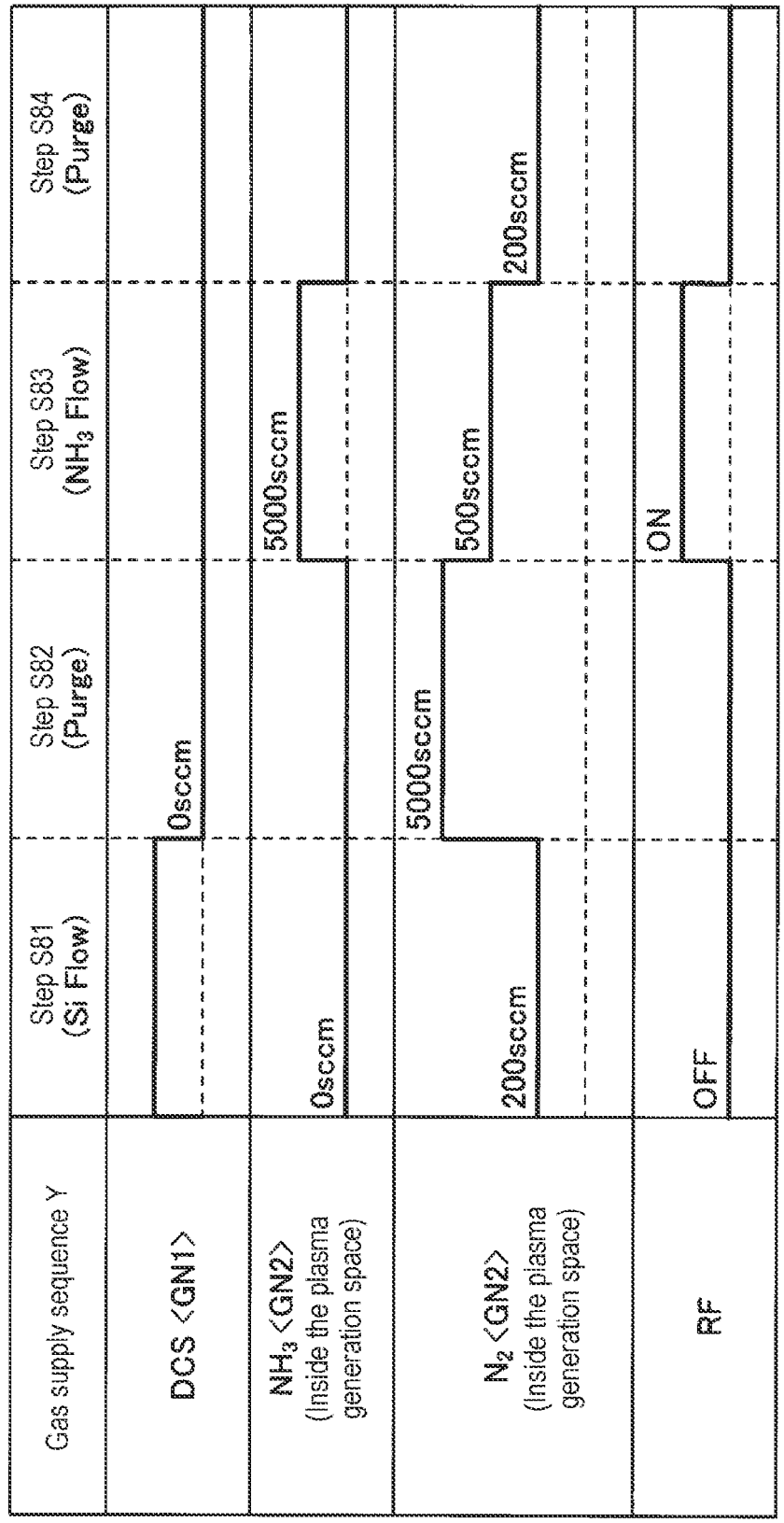
FIG. 11 is a diagram showing an example of a gas supply sequence of a plasma processing method in the reference example.

An example of a plasma processing method according to a reference example will be described with reference to FIGS. 10 and 11. FIG. 10 is a diagram for explaining the arrangement of gas nozzles in the reference example. FIG. 11 is a diagram showing an example of the plasma processing method according to the reference example, which shows an example of the gas supply sequence for one cycle when a SiN film is formed by an ALD method. Hereinafter, the gas supply sequence shown in FIG. 11 is also referred to as "gas supply sequence Y".

In the reference example, gas nozzles GN1, GN4, GN5 and GN6 are provided inside the processing container 1 and outside the plasma generation space P, and a gas nozzle GN2 is provided in the plasma generation space P.

The gas nozzles GN1, GN2, GN4 and GN5 are dispersion nozzles that extend along the vertical direction of the processing container 1 and discharge gases substantially horizontally toward the wafers W from a plurality of gas holes formed at intervals in the length direction thereof. The gas nozzle GN6 is a nozzle that discharges a gas to the lower portion of the processing container 1.

The gas nozzle GN1 is connected to a source of a DCS gas, and is configured to supply the DCS gas into the processing container 1. The gas nozzle GN2 is connected to a source of a hydrogen ($H_2$) gas, a source of an ammonia ($NH_3$) gas and a source of a nitrogen ($N_2$) gas, and is configured to supply the hydrogen gas, the ammonia gas and the nitrogen gas to the plasma generation space P. The gas nozzle GN4 is connected to a source of a nitrogen ($N_2$) gas, and is configured to supply the nitrogen gas into the processing container 1. The gas nozzle GN5 is connected to a source of a nitrogen ($N_2$) gas, and is configured to supply the nitrogen gas into the processing container 1. The gas nozzle GN6 is connected to a source of a nitrogen ($N_2$) gas, and is configured to continuously supply the nitrogen gas to the lower portion of the processing container 1. The gas nozzle GN1 is also connected to a source of a nitrogen gas (not shown).

The plasma processing method shown in FIG. 11 is a method of forming a SiN film by repeating a cycle including step S81 of supplying a DCS gas, step S82 of performing purging, step S83 of supplying an ammonia gas and step S84 of performing purging.

The gas supply sequence Y is different from the gas supply sequence A in that in the step S83 of supplying the ammonia gas, the ammonia gas is supplied to the plasma generation space P from the gas nozzle GN2 provided in the plasma generation space P. The other points are the same as those of the gas supply sequence A.

In the gas supply sequence Y, the ammonia gas is allowed to flow from the plasma generation space P and is excited. Therefore, the particles generated by plasma sputtering are carried to the wafers W by the gas flow moving from the plasma generation space P toward the inside of the processing container 1. As a result, the particles tend to adhere to the wafers W.

Another example of the plasma processing method according to the reference example will be described with reference to FIGS. 10 and 12. FIG. 12 is a diagram showing another example of the plasma processing method according to the reference example, which shows an example of the gas supply sequence for one cycle when a SiN film is formed by an ALD method. Hereinafter, the gas supply sequence shown in FIG. 12 is also referred to as "gas supply sequence Z".

The plasma processing method shown in FIG. 12 is a method of forming a SiN film by repeating a cycle including step S91 of supplying a DCS gas, step S92 of performing purging, step S95 of supplying a hydrogen gas, step S93 of supplying an ammonia gas, and step S94 of performing purging.

The gas supply sequence Z is different from the gas supply sequence B in that the ammonia gas is supplied to the plasma generation space P from the gas nozzle GN2 provided in the plasma generation space P in the step S93 of supplying the ammonia gas. Further, the gas supply sequence Z is different from the gas supply sequence B in that the hydrogen gas is supplied to the plasma generation space P from the gas nozzle GN2 provided in the plasma generation space P in the step S95 of supplying the hydrogen gas. The other points are the same as those of the gas supply sequence B.

In the gas supply sequence Z, the ammonia gas and the hydrogen gas are allowed to flow from the plasma generation space P and are excited. Therefore, the particles generated by plasma sputtering are carried to the wafers W by the gas flow moving from the plasma generation space P toward the inside of the processing container 1. As a result, the particles tend to adhere to the wafers W.

[Evaluation of Particles]

In order to confirm the effects of the plasma processing apparatus 100 according to the embodiment, evaluation was conducted as to how a difference in the supply position of the ammonia gas when forming the SiN film on the wafer W by an ALD method using a DCS gas and an ammonia gas affects the number of particles adhering to the wafer W.

In the evaluation of particles, a series of operations of loading wafers W into the processing container 1, performing a film forming process for forming a SiN film on each of the loaded wafers W, unloading the processed wafers W, and measuring the number of particles adhering to each of the processed wafers W were repeated. In the film forming process, the gas supply sequence A and the gas supply sequence Y were used.

Figure 13A:
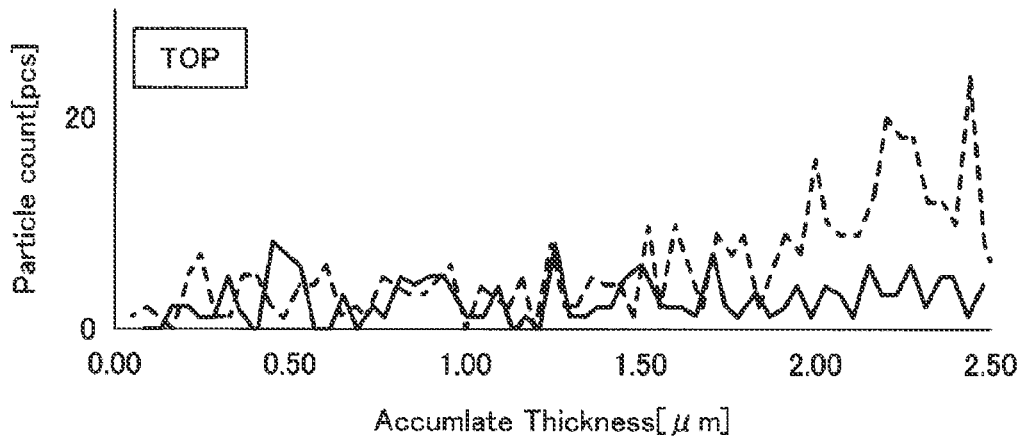
FIGS. 13A, 13B and 13C are diagrams showing changes in the number of particles
Figure 13B:
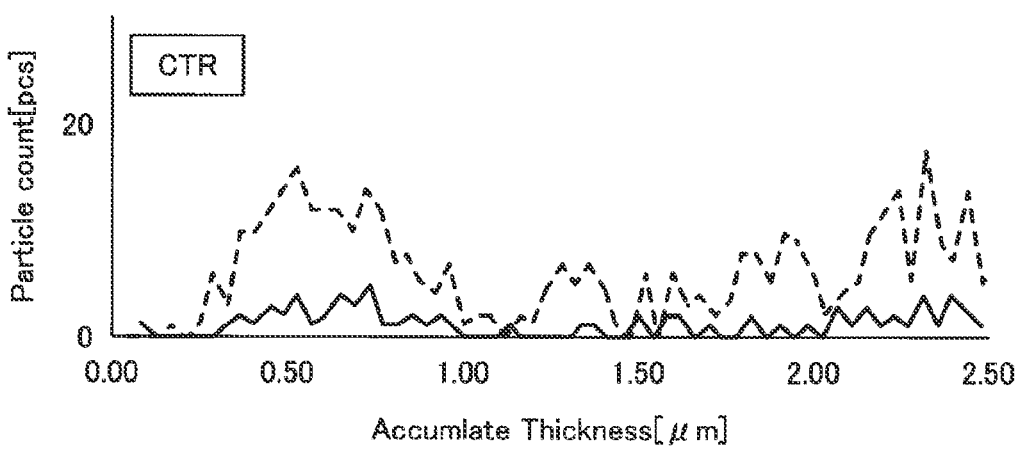
Figure 13C:
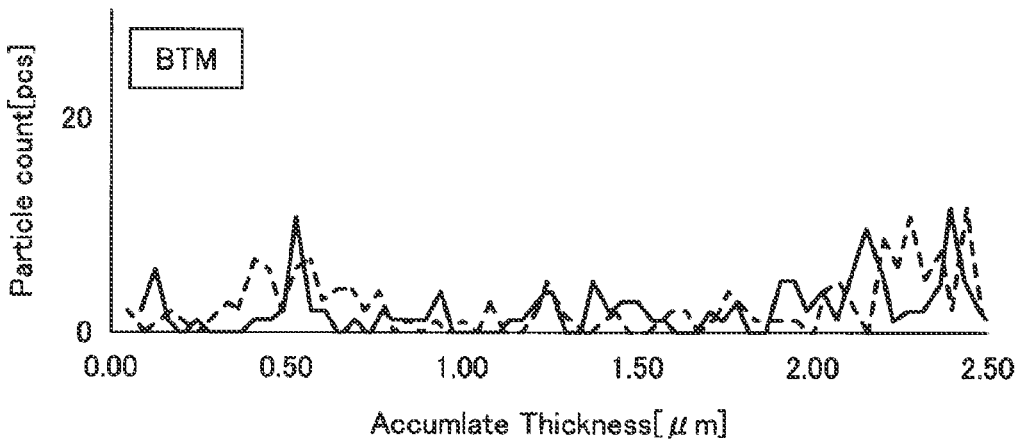

FIGS. 13A, 13B and 13C are diagrams showing changes in the number of particles. FIGS. 13A, 13B and 13C show the results for the wafers W mounted in the upper (TOP) region, the central portion (CTR) region and the lower (BTM) region of the wafer boat 5 in the vertical direction, respectively. In FIGS. 13A, 13B and 13C, the horizontal axis represents the thickness ($\mu$m) of a deposit deposited on the inner wall of the processing container 1, and the vertical axis represents the number of particles (pcs) adhering to the wafer W and having a particle size of 1 $\mu$m or more. Further, in FIGS. 13A, 13B and 13C, the solid line shows the result when the gas supply sequence A is used, i.e., when the ammonia gas is supplied from the gas nozzle provided outside the plasma generation space P. The broken line shows the result when the gas supply sequence Y is used, i.e., when the ammonia gas is supplied from the gas nozzle provided in the plasma generation space P.

As shown in FIG. 13A, in the TOP region, when the ammonia gas is supplied from the gas nozzle provided in the plasma generation space P, if the thickness of the deposit deposited on the inner wall of the processing container 1 exceeds 1.5 $\mu$m, the number of particles adhering to the wafer W increases. On the other hand, when the ammonia gas is supplied from the gas nozzle provided outside the plasma generation space P, even if the thickness of the deposit deposited on the inner wall of the processing container 1 reaches 2.5 $\mu$m, there is no increase in the number of particles adhering to the wafer W.

As shown in FIG. 13B, in the CTR region, when the ammonia gas is supplied from the gas nozzle provided in the plasma generation space P, if the thickness of the deposit deposited on the inner wall of the processing container 1 exceeds 0.25 $\mu$m, the number of particles adhering to the wafer W increases. On the other hand, when the ammonia gas is supplied from the gas nozzle provided outside the plasma generation space P, even if the thickness of the deposit deposited on the inner wall of the processing container 1 reaches 2.5 $\mu$m, there is no increase in the number of particles adhering to the wafer W.

As shown in FIG. 13C, in the BTM region, there is no difference in the number of particles between the case where the ammonia gas is supplied from the gas nozzle provided outside the plasma generation space P and the case where the ammonia gas is supplied from the gas nozzle provided in the plasma generation space P.

From these results, it can be said that, by supplying the ammonia gas from the gas nozzle provided outside the plasma generation space P, the adhesion of particles to the wafers W can be suppressed rather than supplying the ammonia gas from the gas nozzle provided in the plasma generation space P.

[Evaluation of Film Thickness]

The influence of the difference in the supply position of the ammonia gas on the film thickness when forming the SiN film on the wafer W by the ALD method using the DCS gas and the ammonia gas was evaluated in order to confirm the influence on the film properties of the SiN film formed by the plasma processing apparatus 100 according to the embodiment.

In the evaluation of the film thickness, wafers W were loaded into the processing container 1, a film forming process for forming a SiN film on each of the loaded wafers W was performed, the processed wafers W were unloaded, and the film thickness of the SiN film was measured at a plurality of positions in the plane of each of the processed wafers W. In the film forming process, the gas supply sequence A and the gas supply sequence Y were used.

Figure 14A:
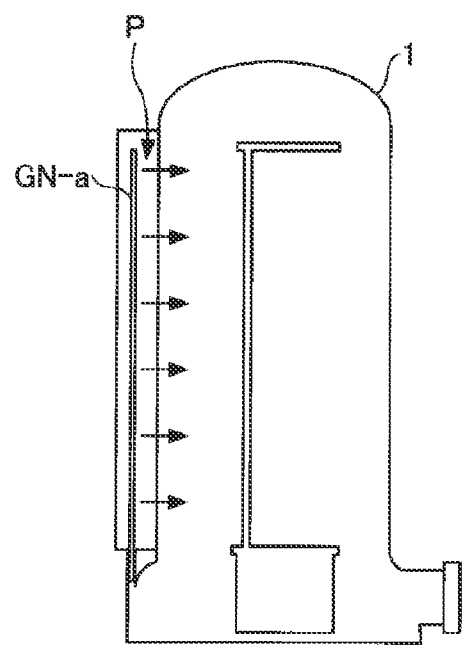
FIGS. 14A, 14B and 14C are diagrams for explaining the positions and types of gas nozzles.
Figure 14B:
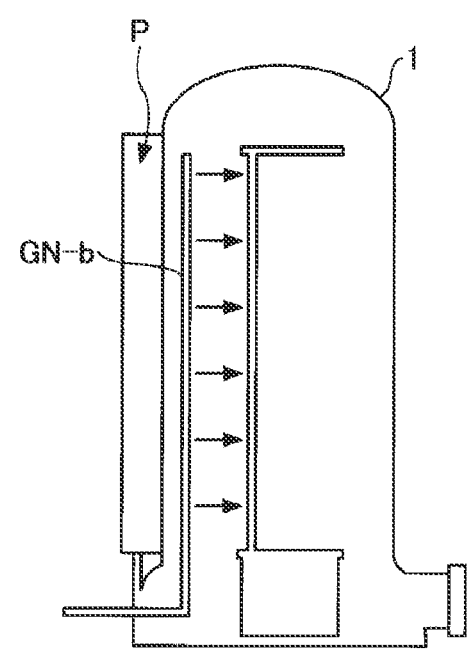

Specifically, a silicon-containing gas was supplied from a gas nozzle provided outside the plasma generation space P. An ammonia gas was supplied from the gas nozzles shown in FIGS. 14A, 14B and 14C. The gas nozzle GN-a shown in FIG. 14A is a dispersion nozzle that extends along the vertical direction of the processing container 1 inside the plasma generation space P and discharges a gas substantially horizontally toward the wafers W from a plurality of gas holes formed at intervals in the length direction thereof. The gas nozzle GN-b shown in FIG. 14B is a dispersion nozzle that extends along the vertical direction of the processing container 1 outside the plasma generation space P and discharges a gas substantially horizontally toward the wafers W from a plurality of gas holes formed at intervals in the length direction thereof. The gas nozzle GN-c shown in FIG.

Figure 14C:
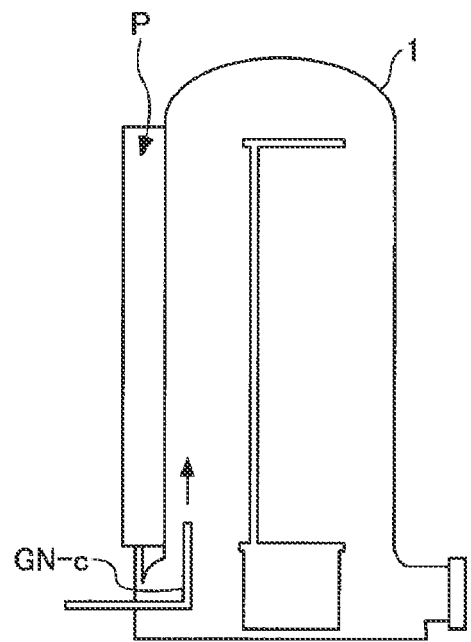

14C is an L-shaped nozzle provided outside the plasma generation space P and configured to discharge a gas from the lower side to the upper side of the processing container 1. FIGS. 14A, 14B and 14C are diagrams for explaining the positions and types of the gas nozzles.

Figure 15:
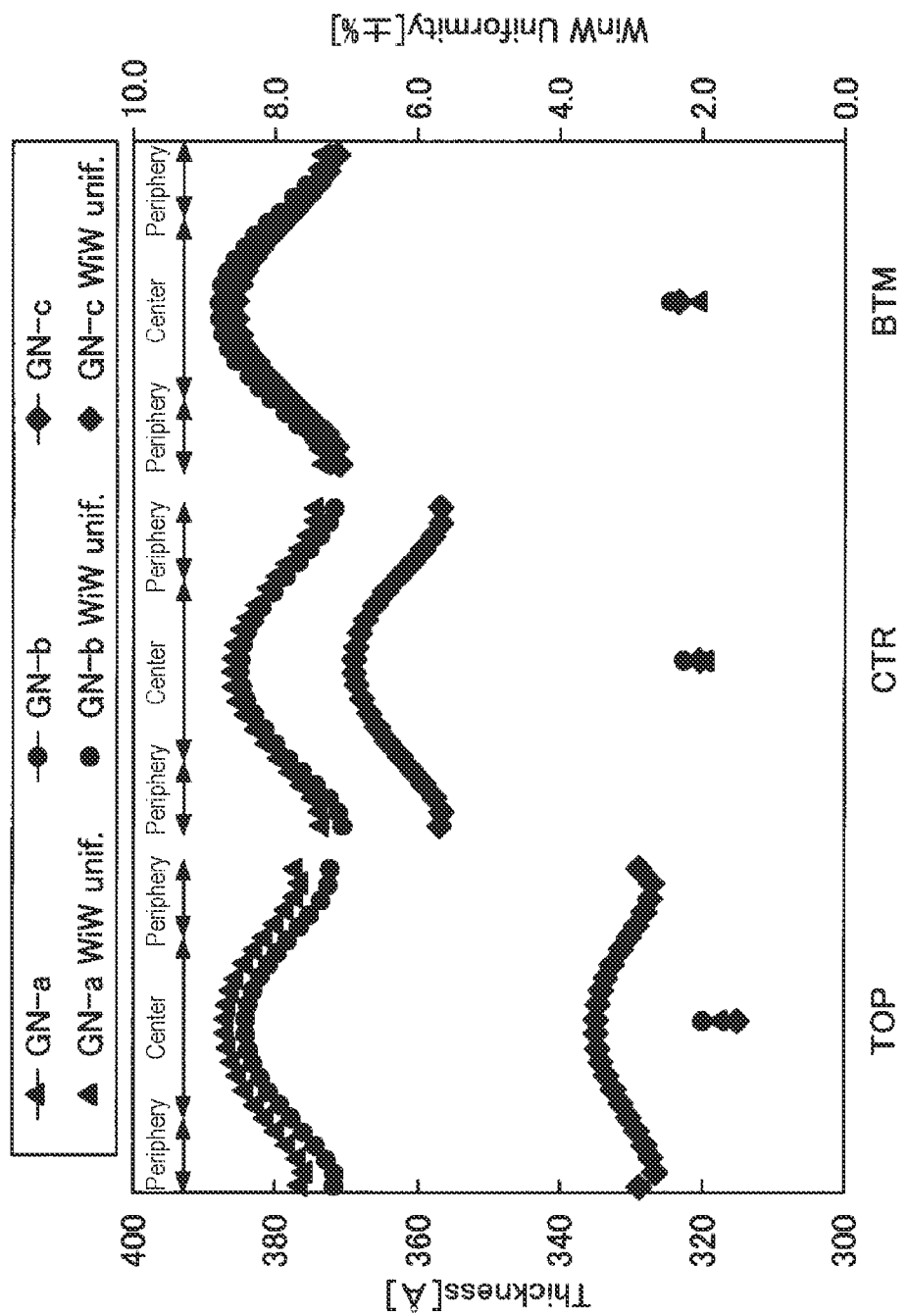
FIG. 15 is a diagram showing the film thickness and in-plane uniformity of a SiN film.

FIG. 15 is a diagram showing the film thickness and in-plane uniformity of the SiN film which shows the film thickness of the SiN film and the in-plane uniformity of the film thickness of the SiN film in the TOP region, the CTR region and the BTM region. The left axis in FIG. 15 represents the film thickness (Thickness) (A), and the right axis represents the in-plane uniformity (WinW Uniformity) (t %). In FIG. 15, the black triangle mark with a solid line, the black circle mark with a solid line and the black rhombus mark with a solid line indicate the film thicknesses of the SiN film when using the gas nozzle GN-a, the gas nozzle GN-b and the gas nozzle GN-c, respectively. Further, in FIG. 15, the black triangle mark without a solid line, the black circle mark without a solid line and the black rhombus mark without a solid line indicate the in-plane uniformities of the film thicknesses of the SiN film when using the gas nozzle GN-a, the gas nozzle GN-b and the gas nozzle GN-c, respectively.

As shown in FIG. 15, regarding the in-plane uniformity of the film thickness of the SiN film, even when the gas nozzles GN-b and GN-c provided outside the plasma generation space P are used, substantially the same result as in the case of using the gas nozzle GN-a provided inside the plasma generation space P was obtained. Further, regarding the film thickness of the SiN film, even when the dispersion nozzle GN-b provided outside the plasma generation space P is used, substantially the same result as in the case of using the dispersion nozzle GN-a provided inside the plasma generation space P was obtained. Moreover, even when the L-shaped nozzle GN-c provided outside the plasma generation space P is used, the film thickness of the SiN film was slightly reduced in the CTR region and the TOP region. From these results, it can be said that when a gas nozzle for supplying an ammonia gas is provided outside the plasma generation space P, it is preferable to use the dispersion nozzle GN-b from the viewpoint that the dispersion nozzle GN-b has a little influence on the film thickness of the SiN film and the in-plane uniformity of the film thickness of the SiN film.

Next, a case where the gas supply sequence B and the gas supply sequence Z are used in the film forming process will be described.

Specifically, a silicon-containing gas was supplied from a gas nozzle provided outside the plasma generation space P. An ammonia gas and a hydrogen gas were supplied from the gas nozzle GN-a shown in FIG. 14A and the gas nozzle GN-b shown in FIG. 14B.

Figure 16:
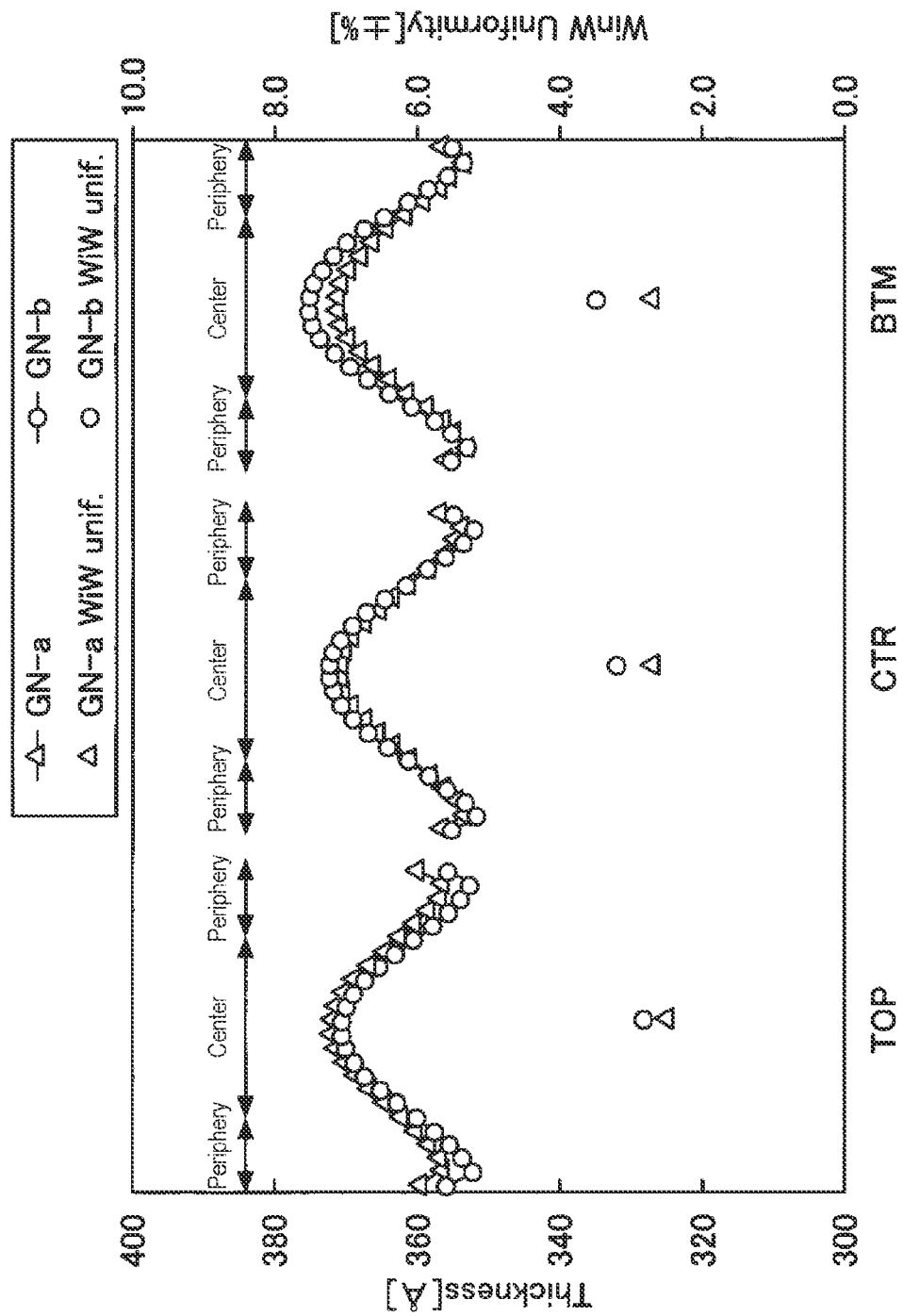
FIG. 16 is a diagram showing the film thickness and in-plane uniformity of the SiN film.

FIG. 16 is a diagram showing the film thickness and in-plane uniformity of the SiN film, which shows the film thickness of the SiN film and the in-plane uniformity of the film thickness of the SiN film in the TOP region, the CTR region and the BTM region. The left axis in FIG. 16 represents the film thickness (A), and the right axis represents the in-plane uniformity (+%). In FIG. 16, the white triangle mark with a solid line and the white circle mark with a solid line indicate the film thicknesses of the SiN film when using the gas nozzle GN-a and the gas nozzle GN-b, respectively. Further, in FIG. 16, the white triangle mark without a solid line and the white circle mark without a solid line indicate the in-plane uniformities of the film thickness of the SiN film when using the gas nozzle GN-a and the gas nozzle GN-b, respectively.

As shown in FIG. 16, regarding the film thickness of the SiN film and the in-plane uniformity of the film thickness of the SiN film, even when the gas nozzle GN-b provided outside the plasma generation space P is used, substantially the same result as in the case of using the gas nozzle GN-a provided inside the plasma generation space P was obtained. From this result, it is considered that even when the gas nozzles for supplying the hydrogen gas and the ammonia gas are provided outside the plasma generation space P, the influence of the respective gas nozzle on the film thickness of the SiN film and the in-plane uniformity of the film thickness of the SiN film is small.

[Evaluation of Film Quality]

In order to confirm the influence on the properties of a SiN film formed by the plasma processing apparatus 100 according to the embodiment, evaluation was conducted as to how a difference in the supply position of the ammonia gas when forming a SiN film on a wafer W by an ALD method using a DCS gas and an ammonia gas affects the film quality.

In the evaluation of the film quality, wafers W were loaded into the processing container 1, a film forming process for forming a SiN film on each of the loaded wafers W was performed, the processed wafers W were unloaded, and the etching resistance of the SiN film formed on each of the processed wafers W was evaluated. In the evaluation of the etching resistance, the SiN film was wet-etched with 0.25% DHF (diluted hydrofluoric acid), and the etching amount at that time was measured to calculate the etching rate (WER: Wet Etch Rate). It can be determined that the lower the WER, the higher the etching resistance and the better the film quality.

Specifically, a silicon-containing gas was supplied from a gas nozzle provided outside the plasma generation space P. An ammonia gas and a hydrogen gas were supplied from the gas nozzle GN-a shown in FIG. 14A and the gas nozzle GN-b shown in FIG. 14B.

Figure 17:
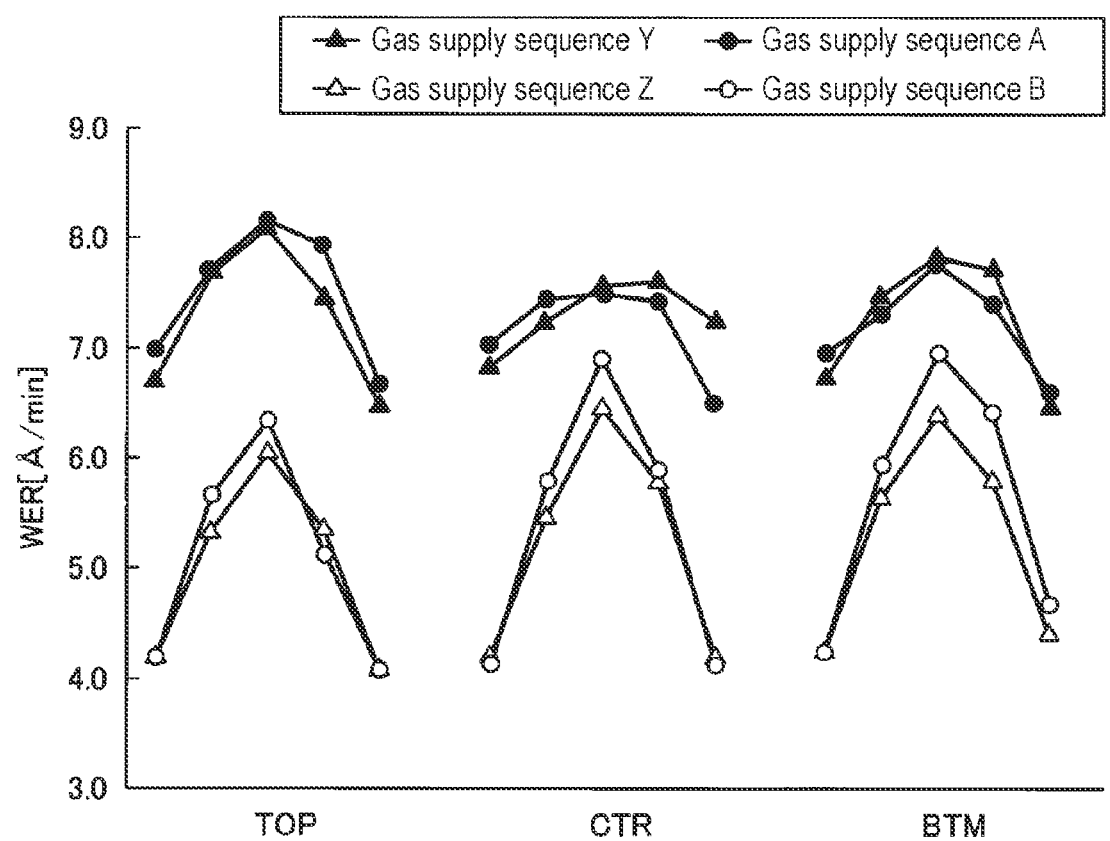
FIG. 17 is a diagram showing the WER of the SiN film.

FIG. 17 is a diagram showing the WER of the SiN film, which shows the WER of the SiN film in the TOP region, the CTR region and the BTM region. The vertical axis in FIG. 17 represents the WER (A/mm). In FIG. 17, the black triangle mark with a solid line indicates the WER of a SiN film formed by the gas supply sequence Y using the gas nozzle GN-a, and the black circle mark with a solid line indicates the WER of a SiN film formed by the gas supply sequence A using the gas nozzle GN-b. Further, the white triangle mark with a solid line indicate the WER of a SiN film formed by the gas supply sequence Z using the gas nozzle GN-a, and the white circle mark with a solid line indicates the WER of a SiN film formed by the gas supply sequence B using the gas nozzle GN-b.

As shown in FIG. 17, there is almost no difference in WER between the SiN film formed by the gas supply sequence A and the SiN film formed by the gas supply sequence Y. Further, in the CTR region and the BTM region, the WER of the SiN film formed by the gas supply sequence B was slightly larger than the WER of the SiN film formed by the gas supply sequence Z.

In the above-described embodiments, the gas nozzle 22 is an example of a processing gas supplier, and the gas nozzle 23 is an example of a purge gas supplier. Further, the DCS gas is an example of a raw material gas, the ammonia gas is an example of a reaction gas, and the hydrogen gas is an example of a modifying gas.

The embodiments disclosed herein should be considered to be exemplary in all respects and not restrictive. The above-described embodiments may be omitted, replaced or modified in various forms without departing from the scope of the appended claims and the spirit thereof.

In the above-described embodiments, the case where the plasma processing apparatus 100 includes a pair of plasma electrodes 33 arranged so as to face away from each other, i.e., the case where the plasma processing apparatus 100 includes capacitively coupled plasma electrodes 33, has been described as an example. However, the present disclosure is not limited thereto. For example, the plasma processing apparatus 100 may include inductively coupled plasma electrodes provided on the plasma partition wall 32 along the longitudinal direction thereof.

In the above-described embodiments, the case where the processing container 1 has a single tube structure has been described as an example. However, the present disclosure is not limited thereto. For example, the processing container 1 may have a double tube structure including an inner tube and an outer tube.

In the above-described embodiments, the case where the film is formed by the ALD method has been described as an example. However, the present disclosure is not limited thereto. For example, it may be applied to a case where a film is formed by a chemical vapor deposition (CVD) method.

In the above-described embodiments, the ammonia gas and the hydrogen gas have been described as examples of the plasma generation gas. However, the present disclosure is not limited thereto. For example, the plasma generation gas may be a nitrogen gas, an argon gas, a helium gas, or an oxygen gas.

According to the present disclosure in some embodiments, it is possible to suppress the adhesion of particles to a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:
a processing container having a vertical tubular shape and an opening formed in a side wall of the processing container, the processing container configured to accommodate a plurality of substrates in multiple stages;
a plasma partition wall airtightly provided on an outer wall of the processing container and configured to cover the opening and define a plasma generation space;
a plasma electrode provided along the plasma partition wall;
a processing gas nozzle provided outside the plasma generation space and inside the processing container, and configured to supply a plasma generation gas; and
a controller programmed to execute:
supplying the plasma generation gas into the processing container by the processing gas nozzle;
causing the plasma generation gas supplied into the processing container to be diffused into the plasma generation space via the opening;
converting the plasma generation gas into plasma to generate active species in the plasma generation space by supplying an RF power to the plasma electrode; and
supplying the active species into the processing container via the opening.

2. The apparatus of claim 1, wherein the opening is elongated in a height direction of the processing container.

3. The apparatus of claim 1, wherein the opening has such a length that the opening covers all of the plurality of substrates in a height direction.

4. The apparatus of claim 1, wherein the processing gas nozzle includes a dispersion nozzle extending along a height direction of the processing container and having a plurality of gas holes formed at intervals in a length direction of the dispersion nozzle.

5. The apparatus of claim 1, further comprising:
a purge gas supplier provided in the plasma generation space and configured to supply a purge gas.

6. The apparatus of claim 5, wherein the purge gas supplier includes a dispersion nozzle extending along a height direction of the processing container and having a plurality of gas holes formed at intervals in a length direction of the dispersion nozzle.

7. The apparatus of claim 1, wherein the plasma electrode includes a pair of electrodes arranged on outer surfaces on both sides of the plasma partition wall so as to face away from each other.

8. The apparatus of claim 1, wherein the plasma electrode includes an inductively coupled electrode provided on the plasma partition wall along a longitudinal direction of the plasma partition wall.

9. A plasma processing method, comprising:
accommodating a plurality of substrates in multiple stages inside a processing container having a vertical tubular shape and an opening formed in a side wall of the processing container;
supplying a plasma generation gas into the processing container by a processing gas nozzle provided outside a plasma generation space, which is defined by a plasma partition wall airtightly provided on an outer wall of the processing container to cover the opening, and inside the processing container;
causing the plasma generation gas supplied into the processing container to be diffused into the plasma generation space via the opening;
converting the plasma generation gas into plasma to generate active species in the plasma generation space by supplying an RF power to a plasma electrode provided along the plasma partition wall; and
supplying the active species into the processing container via the opening.

10. The plasma processing method of claim 9, further comprising:
supplying a purge gas to the plasma generation space.

11. The plasma processing method of claim 10, further comprising:
supplying a raw material gas into the processing container, and
wherein the plasma generation gas is a reaction gas that reacts with the raw material gas to generate a reaction product, and
a cycle that includes the supplying the raw material gas, the supplying the plasma generation gas, the causing the plasma generation gas to be diffused into the plasma generation space, the converting the plasma generation gas into plasma, the supplying the active species into the processing container, and the supplying the purge gas is repeated.

12. The plasma processing method of claim 11, further comprising:
converting a modifying gas into plasma by supplying the modifying gas into the processing container outside the plasma generation space and supplying the RF power to the plasma electrode, and
wherein a cycle that includes the supplying the raw material gas, the supplying the plasma generation gas, the causing the plasma generation gas to be diffused into the plasma generation space, the converting the plasma generation gas into plasma, the supplying the active species into the processing container, the supplying the purge gas,_ and the converting the modifying gas into plasma is repeated.

13. The plasma processing method of claim 12, wherein the raw material gas is a dichlorosilane (DCS) gas, the reaction gas is an ammonia gas, and the modifying gas is a hydrogen gas.

* * * * *